(12) United States Patent
Yamauchi et al.

(10) Patent No.: US 6,542,401 B2
(45) Date of Patent: Apr. 1, 2003

(54) SRAM DEVICE

(75) Inventors: Hiroyuki Yamauchi, Osaka (JP); Yoshinori Yamagami, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/043,134

(22) Filed: Jan. 14, 2002

(65) Prior Publication Data

US 2002/0105826 A1 Aug. 8, 2002

(30) Foreign Application Priority Data

Feb. 8, 2001 (JP) ........................................ 2001-032028

(51) Int. Cl.$^7$ .............................................. G11C 11/00
(52) U.S. Cl. ........................ 365/154; 365/203; 365/156
(58) Field of Search ................................. 365/154, 203, 365/156, 190, 189.01, 189.05, 189.09

(56) References Cited

U.S. PATENT DOCUMENTS 5,715,191 A * 2/1998 Yamauchi et al. .......... 365/154
5,757,702 A * 5/1998 Iwata et al. ................. 365/154
5,875,139 A    2/1999 Semi
5,933,373 A    8/1999 Takahashi
6,118,708 A    9/2000 Yoshida et al.

FOREIGN PATENT DOCUMENTS

JP    2845212      10/1998
JP    2000-76863    3/2000

* cited by examiner

*Primary Examiner*—David Lam
(74) *Attorney, Agent, or Firm*—McDermott, Will & Emery

(57) ABSTRACT

An SRAM device of the present invention is an SRAM device, including: a plurality of bit line pairs that are arranged substantially parallel to one another and connected to different memory cells, respectively; selection means for selecting one bit line pair from among the plurality of bit line pairs; and potential holding means for holding a precharge potential of bit lines that are respectively on opposite sides of the one bit line pair with the one bit line pair being selected, wherein an interval between two adjacent bit line pairs is smaller than an interval between two bit lines of the same bit line pair.

14 Claims, 11 Drawing Sheets

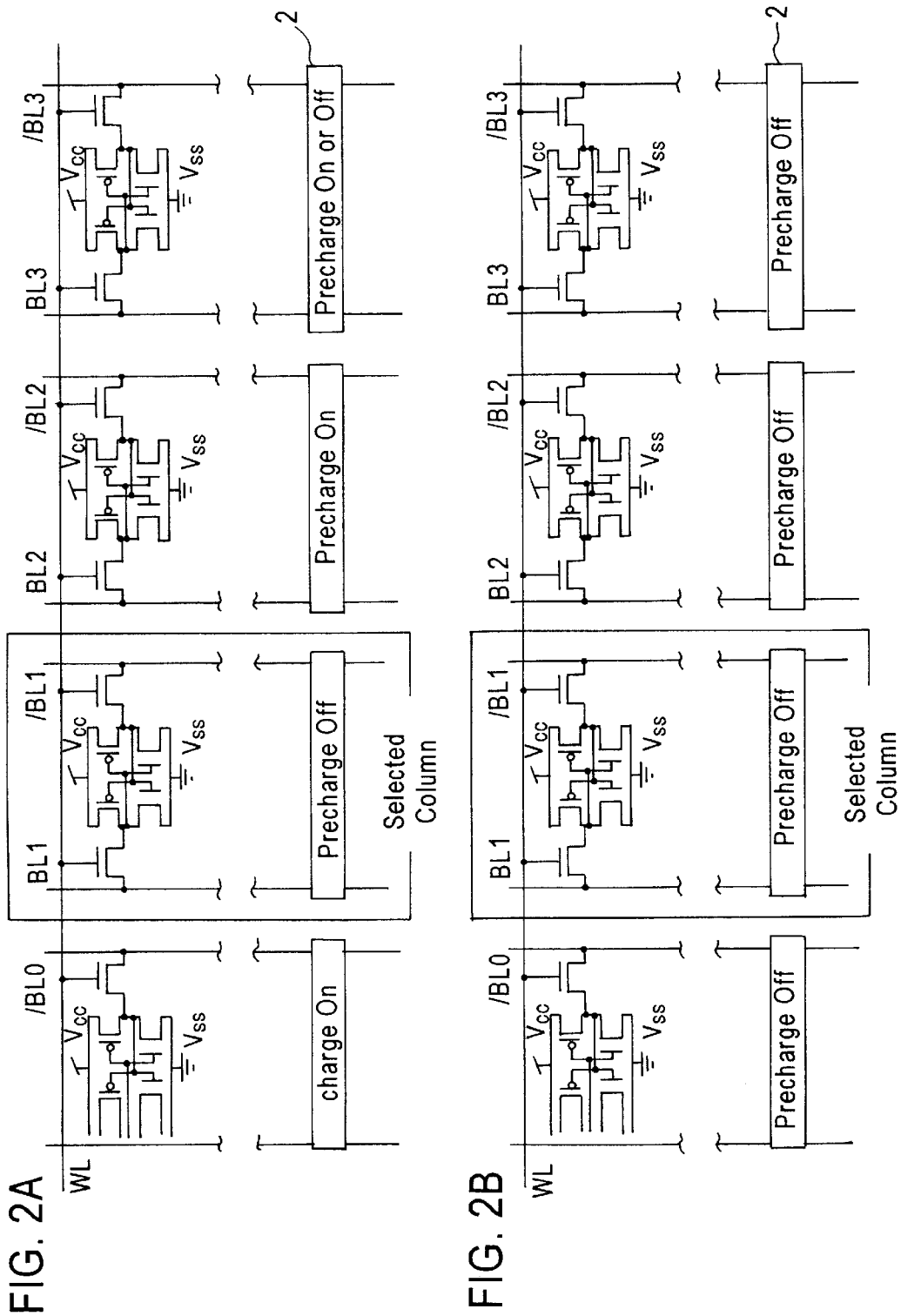

FIG. 4

Control of each bit line pair (Case 1)
Right-side adjacent column selection signal —— ADDR (for odd-numbered columns
Left-side adjacent column selection signal —— ADDR (for even-numbered columns ADDR is "H" if columns on opposite sides of selected column are non-selected column (Case 2)
Odd-numbered column selected signal —— ADDR (for odd-numbered columns
Even-numbered column selected signal —— ADDR (for even-numbered columns ADDR for even-numbered is "H" when odd-numbered column is selected (Case 3)
Signal indicating whether or not in write operation used in Case 1 or Case 2 —— WRITE
Enable Case 1 or Case 2 only in write operation Conventional bit line arrangement Bit line arrangement in one embodiment
of the present invention

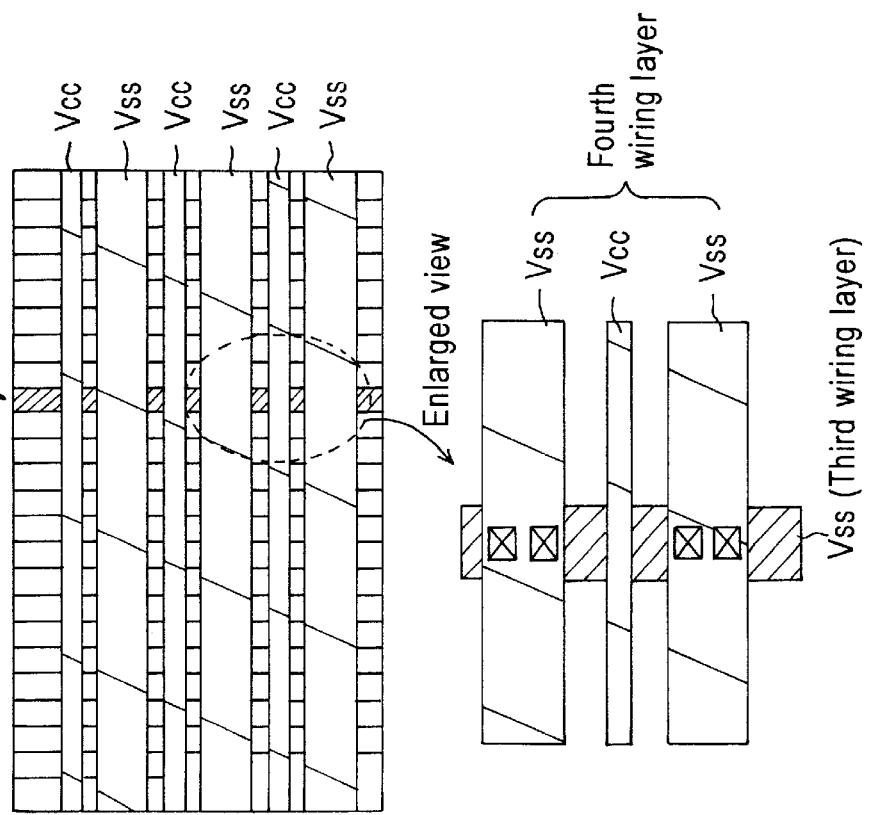
FIG. 8B
FIG. 8C
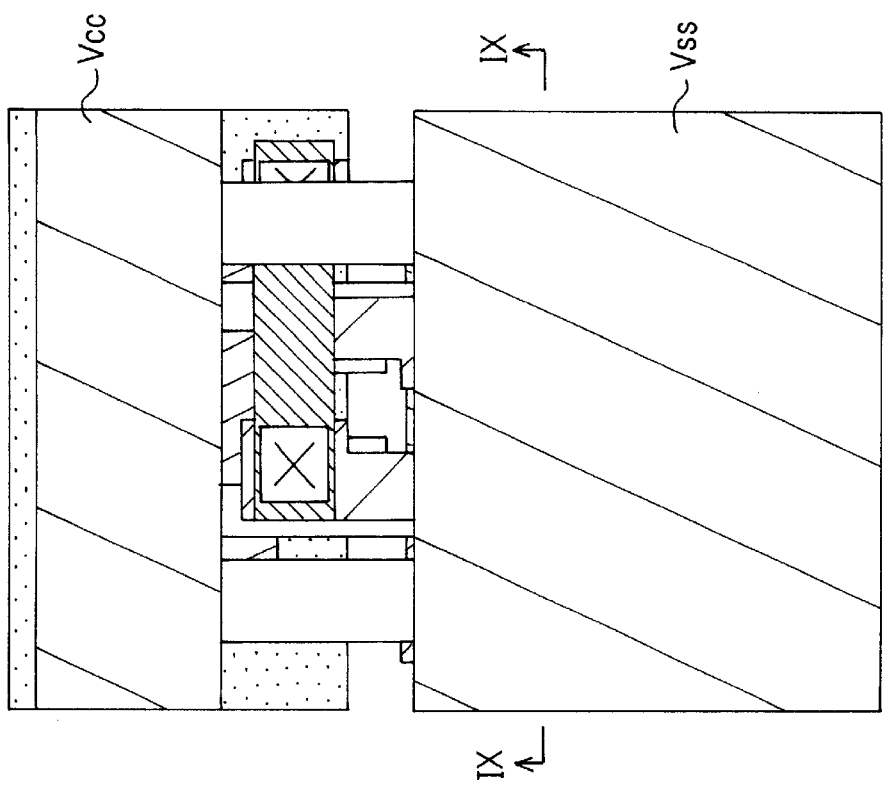
FIG. 8A

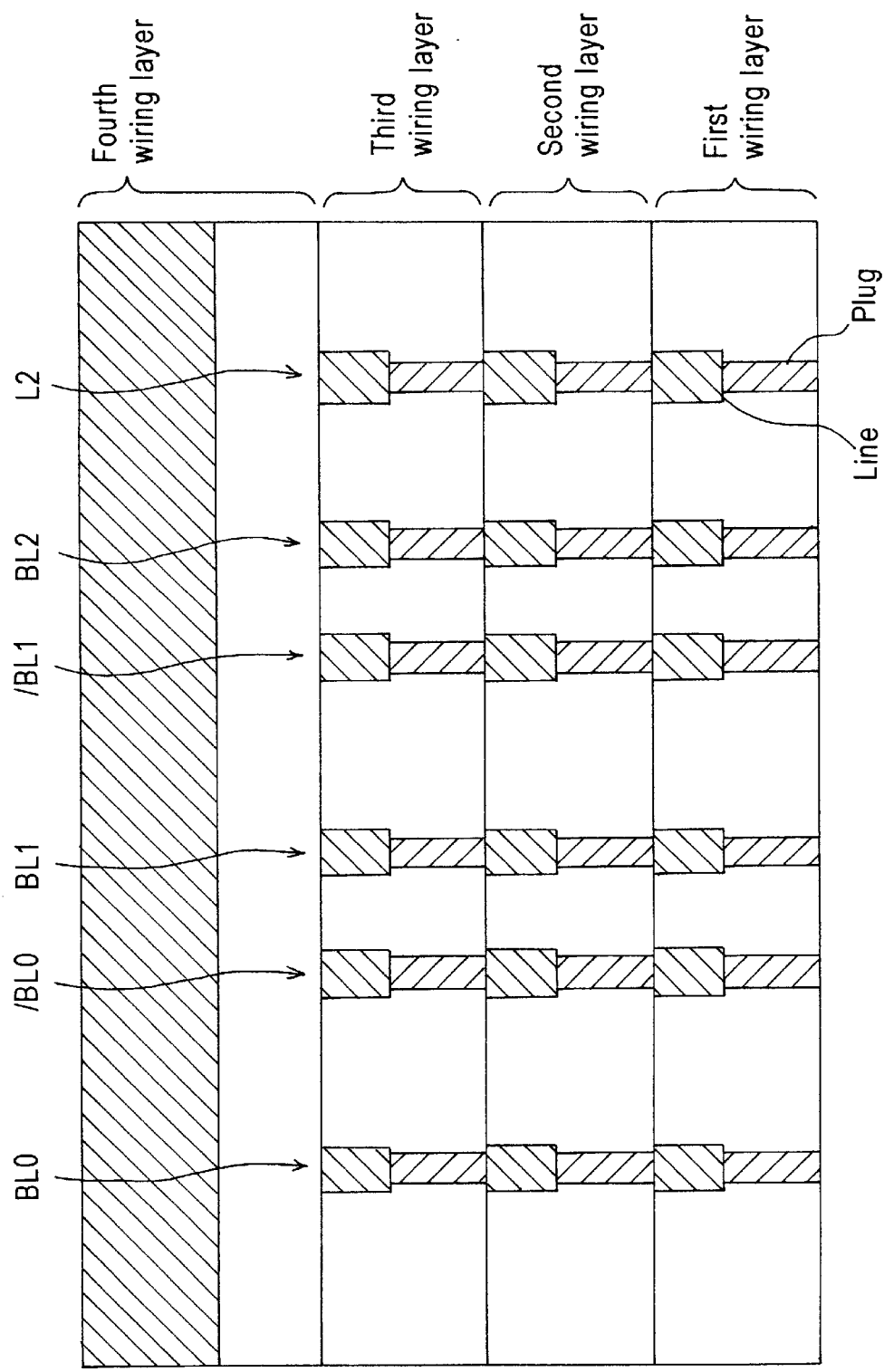

＃ SRAM DEVICE

BACKGROUND OF THE INVENTION

The present invention relates to an SRAM device, and more particularly to stabilizing the operation thereof.

In a conventional 6-transistor SRAM device, an inter line coupling occurs between a pair of bit lines BL1 and /BL1, thereby causing coupling noise. In order to suppress the coupling noise, there is a technique of shielding bit lines by, for example, providing a separate ground line Vss between the pair of bit lines BL1 and /BL1 in the same wiring layer. FIG. 10 illustrates a memory cell 100 of an SRAM device produced by using this technique. FIG. 11 is a cross-sectional view schematically illustrating wiring layers and connection holes in an area above three memory cells 100. FIG. 11 is a cross-sectional view taken along line XI—XI shown in FIG. 10, schematically illustrating all the connection holes and the lines connected thereto being projected onto a plane.

As illustrated in FIG. 10, a total of three lines, including two bit lines (BL1 and /BL1) and a ground line Vss, are connected to the memory cell 100. As illustrated in FIG. 11, the lines are arranged at substantially the minimum pitch both in the bit line width direction and in the connection hole depth direction.

In an SRAM device including the memory cell 100 illustrated in FIG. 10 and FIG. 11, the two bit lines BL1 and /BL1 are completely shielded from each other by the ground line Vss provided therebetween, thereby suppressing the coupling noise in the bit line pair. However, the distance between each of the two bit lines BL1 and /BL1 and the ground line Vss is short, thereby increasing the line capacitance. Particularly, the line capacitance further increases as the interval between lines decreases along with the miniaturization of memory cells. The small interval between lines increases the chance of the two bit lines BL1 and /BL1 being short-circuited with the ground line Vss due to a process dust defect. If the two bit lines BL1 and /BL1 are short-circuited with the ground line Vss, a short-circuit leak current flows via a precharge circuit while the two bit lines BL1 and /BL1 are being precharged to the power supply voltage. This leak current remains even if the two bit lines BL1 and /BL1 are replaced by a redundant cell.

As illustrated in FIG. 11, no line is provided between the memory cell 100 and an adjacent bit line (/BL0, BL2). Therefore, coupling noise still occurs between /BL0 and BL1 and between /BL1 and BL2.

The problem of coupling noise can be solved by providing a shielding ground line or a shielding power supply line between the two bit lines (BL1 and /BL1) of the memory cell 100 and the respective adjacent bit lines (/BL0 and BL2). Then, however, the interval between a bit line and the shielding ground line or the shielding power supply line is very small, thereby further increasing the line capacitance. This increases the charging/discharging time of the pair of bit lines (BL1 and /BL1), thereby presenting a problem that there will be an increased amount of time before a potential change of 100 mV, for example, occurs, i.e., an increased delay time until the timing at which a read sense amplifier is turned ON.

In a write operation, the voltage applied to each of the two bit lines (BL1 and /BL1) dynamically changes from the power supply voltage to the ground level. Then, quite substantial coupling noise occurs between the adjacent bit lines /BL0 and BL1 and between the adjacent bit lines /BL1 and BL2. This substantially changes the voltages being applied to the adjacent bit lines /BL0 and BL2. Therefore, the information stored in a memory cell adjacent to the memory cell 100 may be destroyed.

SUMMARY OF THE INVENTION

The present invention has been made in order to solve the problems described above, and has an object to provide an SRAM device capable of performing a stable operation.

An SRAM device of the present invention is an SRAM device, including: a plurality of bit line pairs that are arranged substantially parallel to one another and connected to different memory cells, respectively; selection means for selecting one bit line pair from among the plurality of bit line pairs; and potential holding means for holding a precharge potential of bit lines that are respectively on opposite sides of the one bit line pair with the one bit line pair being selected, wherein an interval between two adjacent bit line pairs is smaller than an interval between two bit lines of the same bit line pair.

By holding the precharge potential of bit line pairs that are adjacent to, and respectively on opposite sides of, a selected bit line pair, the bit lines that are adjacent to, and respectively on opposite sides of, the selected bit line pair can behave as shield lines for the selected bit line pair. Therefore, it is possible to improve the shield effect against the coupling noise between the selected bit line pair and each of the bit lines that are adjacent to, and respectively on opposite sides of, the selected bit line pair, without providing any additional elements or lines. Moreover, the precharge operation is continued for the adjacent bit line pairs, and they behave as if they were power supply lines. Therefore, it is no longer necessary to take into consideration the influence of the coupling between two adjacent bit line pairs. Thus, the interval between two adjacent bit line pairs can be reduced, whereby it is possible to increase the interval between two bit lines of the same pair. Therefore, with the SRAM device of the present invention, it is possible to reduce the capacitance occurring between two bit lines of the same pair. Thus, it is possible to reduce the coupling noise without separately providing a special-purpose shield line between the bit lines of the same pair.

Since the interval between the bit lines of the same pair is large and no special-purpose shield line is provided between the two bit lines of the same pair, a short circuit will not occur between each bit line in one bit line pair and a shield line. Therefore, a short-circuit leak current is prevented from flowing via a precharge circuit while all of the bit lines are precharged to the power supply voltage.

Since the interval between two adjacent bit line pairs is small, it is possible that a short-circuit occurs between two adjacent bit line pairs. However, since all the bit lines are at an equal potential when the bit lines are precharged to the power supply voltage, a short-circuit leak current does not occur due to the short-circuit.

The potential holding means may hold a precharge potential of all of the plurality of bit line pairs excluding the selected bit line pair.

The potential holding means may hold a precharge potential of odd-numbered bit line pairs, counting from the selected bit line pair, and may not hold a precharge potential of even-numbered bit line pairs, counting from the selected bit line pair.

The number of bit line pairs whose precharge potential is held by the potential holding means may be greater than the number of bit line pairs whose precharge potential is not held by the potential holding means.

The potential holding means may hold a precharge potential only in a write operation.

It is preferred that the interval between two adjacent bit line pairs is smaller, and the interval between two bit lines of the same bit line pair is larger, than a thickness of each bit line of the plurality of bit line pairs.

In this way, it is possible to reduce the line capacitance in each bit line pair.

It is preferred that the SRAM device further includes a plurality of wiring layers, wherein one of the plurality of wiring layers in which the bit lines are provided includes no line other than the bit lines in regions above the memory cells.

By providing a special-purpose wiring layer for bit lines, it is possible to ensure a large line interval between a bit line and each of two wiring layers that are respectively above and below the bit line.

It is preferred that: the plurality of wiring layers include a first wiring layer, a second wiring layer, a third wiring layer and a fourth wiring layer, which are layered in this order; ground lines of the memory cells are provided in the first wiring layer and the fourth wiring layer so as to be perpendicular to the bit lines; power supply lines of the memory cells are provided in the second wiring layer and the fourth wiring layer so as to be perpendicular to the bit lines; and the bit lines are provided in the third wiring layer.

In this way, the ground line and the power supply line can be used as shield lines sandwiching a bit line formed in the third wiring layer.

It is preferred that in regions above. the memory cells, no connection hole is provided for connecting the fourth wiring layer to other lower wiring layers including the third wiring layer.

In this way, it is possible to reduce the plug and/or line in the vicinity of a bit line as compared to that in the prior art. Therefore, it is possible to reduce the capacitance of the bit line itself, the capacitance in a bit line pair, and the capacitance between a bit line pair and each of bit lines adjacent to the bit line pair.

Another SRAM device of the present invention is an SRAM device, including: a plurality of bit line pairs that are arranged substantially parallel to one another and connected to different memory cells, respectively; first selection means for selecting one odd-numbered bit line pair, counting from an end bit line pair, from among the plurality of bit line pairs; first potential holding means for holding a precharge potential of even-numbered bit line pairs, counting from the end bit line pair, with the one odd-numbered bit line pair being selected; second selection means for selecting one even-numbered bit line pair, counting from the end bit line pair, from among the plurality of bit line pairs; and second potential holding means for holding a precharge potential of odd-numbered bit line pairs, counting from the end bit line pair, with the one even-numbered bit line pair being selected, wherein an interval between two adjacent bit line pairs is smaller than an interval between two bit lines of the same bit line pair.

With such an SRAM device, when an odd-numbered (even-numbered) bit line pair (counting from an end bit line pair) is selected from among a plurality of bit line pairs, a precharge operation is continued for an even-numbered (odd-numbered) bit line pair. Thus, the precharge potential of bit line pairs that are adjacent to, and respectively on opposite sides of, the selected bit line pair is held. In this way, the bit lines that are adjacent to, and respectively on opposite sides of, the selected bit line pair can behave as shield lines for the selected bit line pair. Therefore, it is possible to improve the shield effect against the coupling noise between the selected bit line pair and the bit lines that are adjacent to, and respectively on opposite sides of, the selected bit line pair, without , providing any additional elements or lines. Alternatively, with the SRAM device of the present invention, the bit line pair selection period may be divided in two so that data is read out from odd-numbered bit line pairs (counting from an end bit line pair) during the first half and from even-numbered bit line pairs (counting from an end bit line pair) during the second half. Thus, the bit line pair selection period may be divided into a number of sub-periods so that a plurality of bit line pairs are selected by selecting a single bit line pair in each of the sub-periods. This is suitable for a case where data that is read out and written is processed in a pipelined process, and increases the data processing speed.

BRIEF DESCRIPTION OF THE DRAWINGS

FIG. 2A is a diagram schematically illustrating a method for driving a 6-transistor SRAM device in one embodiment of the present invention.

FIG. 2B is a diagram schematically illustrating a method for driving a conventional 6-transistor SRAM device.

FIG. 4 is a diagram illustrating a method for driving an SRAM device in one embodiment of the present invention.

FIG. 8A is a diagram illustrating a memory cell of an SRAM device in one embodiment of the present invention.

FIG. 8B shows a diagram illustrating a matrix arrangement of memory cells illustrated in FIG. 8A.

FIG. 8C shows an enlarged view of a portion of the matrix arrangement of FIG. 8B.

FIG. 9 is a cross-sectional view schematically illustrating a wiring layer of an SRAM device in one embodiment of the present invention.

DESCRIPTION OF THE PREFERRED EMBODIMENTS

An embodiment of the present invention will now be described with reference to the drawings.

Figure 1B:
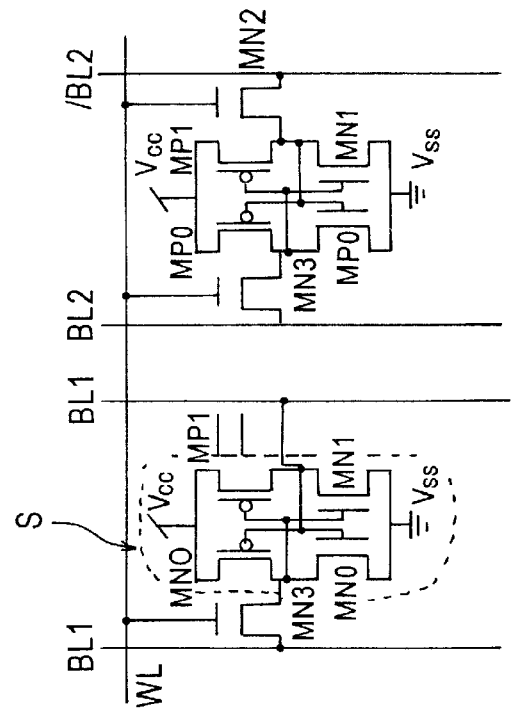
FIG. 1A and FIG. 1B are diagrams each illustrating a memory cell included in an SRAM device in one embodiment of the present invention.
Figure 1A:
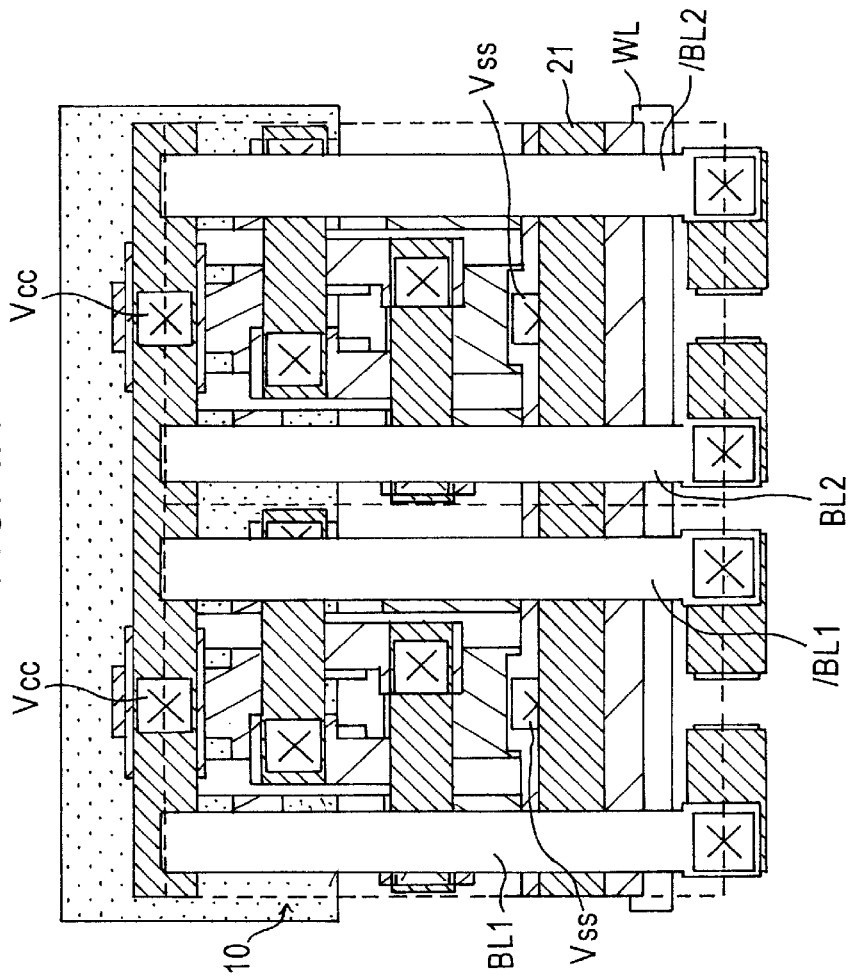

FIG. 1A and FIG. 1B illustrate a memory cell 10 provided in an SRAM device of the present embodiment. As illustrated in FIG. 1A and FIG. 1B, the memory cell 10 of the present embodiment includes a complementary data storage section S, a pair of bit lines (BL1 and /BL1), a word line WL, and a pair of access transistors (MN2 and MN3) connecting the pair of bit lines to the data storage section S. The complementary data storage section S includes a pair of CMOS inverters (one including MOS transistors MP0 and MP1, and the other including MOS transistors MN0 and MN1) that are cross coupled to each other.

In the memory cell 10 of the present embodiment, the interval between two adjacent bit lines /BL1 and BL2 is small, and the interval between the pair of bit lines BL1 and /BL1 is larger than that between the adjacent bit lines /BL1 and BL2.

The SRAM device including the memory cell 10 having such a configuration is driven by a driving method to be described below. A method for driving the SRAM device of the present embodiment will now be described with reference to the drawings.

FIG. 2A is a diagram schematically illustrating the method for driving the 6-transistor SRAM device of the present embodiment. FIG. 2B is a diagram schematically illustrating a method for driving a conventional 6-transistor SRAM device.

As illustrated in FIG. 1B, in a memory cell of the 6-transistor SRAM device, a pair of CMOS inverter circuits are connected to each other in a flip flop configuration, and the pair of access transistors MN2 and MN3 are connected to the respective storage nodes, the word line WL being the gate input of each of the access transistors MN2 and MN3. A data transfer operation, i.e., a read operation or a write operation, is performed between the pair of bit lines BL1 and /BL1 via the access transistors MN2 and MN3. Only when a memory cell is selected, the word line WL is at a logical level "1", thereby turning ON the access transistors MN2 and MN3. Normally, all the bit lines provided in the SRAM device, including the pair of bit lines BL1 and /BL1, are set to an equal potential before a memory cell is selected (hereinafter, this will be referred to as a "precharge" operation), so as to prevent data of the previously selected memory cell from being erroneously written to the next memory cell to be selected.

In the present embodiment, data is not read out from an input/output section by all bit line pairs that are simultaneously accessed by a word line selection operation, but instead, data is read or written by those bit line pairs that are selected by a column selection operation, as illustrated in FIG. 2A. For example, the column selection operation may be an operation of selecting 1/2 (1 pair out of 2 pairs), 1/4 (1 pair out of 4 pairs), 1/8 (1 pair out of 8 pairs) or 1/16 (1 pair out of 16 pairs) of all the bit line pairs. Therefore, only the potential read out by the selected bit line pair (BL1 and /BL1) is of significance, and the potential read out by any non-selected pair of bit lines is of no significance. By utilizing this, the bit line pairs (BL0 and /BL0) and (BL2 and /BL2) adjacent to the selected bit line pair are set to an equal potential when a data read/write operation is performed from/to the input/output section. Specifically, the potential of the bit line pairs (BL0 and /BL0) and (BL2 and /BL2) is held at a precharged state until a data read/write operation is performed from/to the input/output section. In this way, it is possible to have the bit line pairs (BL0 and /BL0) and (BL2 and /BL2) behave as if they were shield lines.

With the conventional driving method, the potential of the bit line pairs (BL0 and /BL0) and (BL2 and /BL2) adjacent to the selected bit line pair is not controlled in a data read/write operation from/to the input/output section. Therefore, as illustrated in FIG. 2B, when the adjacent bit lines /BL0 and BL2 are not at the same potential as in the precharged state, quite substantial coupling noise may occur between the bit lines /BL0 and BL1 and between the bit lines /BL1 and BL2.

With the driving method of the present embodiment, however, it is possible to improve the shield effect against the coupling noise between the selected bit line pair (BL1 and /BL1) and the adjacent bit line pairs (BL0 and /BL0) and (BL2 and /BL2), without providing any additional elements or lines.

The present inventors also found the following phenomenon associated with the relationship between the number N of bit line pairs that are held at the precharged state and the number M of bit line pairs that are released from the precharged state.

1) If N>M, there is an increase in the DC current flowing, via a bit line, between a ground node in a memory cell accessed by a word line and a precharge power supply.

2) Precharge operations are performed simultaneously during a precharge period after releasing the precharged state in a read period. Therefore, if N<M, currents, such as a charge/discharge current for a bit line or a charge/discharge current for controlling a control circuit and a precharge circuit, occur within a very short period of time. Thus, an alternating current having a very short period occurs. The occurrence of the alternating current may cause substantial power supply noise.

With the driving method of the present embodiment, depending on the DC current flowing along a bit line and the alternating current occurring in a period of time from the word line access period to the precharge operation, N and M can be adjusted so as to minimize the total of the DC current and the alternating current described above in 1) and 2).

In order to reduce the access cycle time, it is important to complete the precharge period as soon as possible. A larger value of M requires more charge/discharge current to simultaneously bring all the bit lines to the precharged state in the precharge operation. Since the charge/discharge current occurs in a very short period of time, the current will be an alternating current with a very short period. Therefore, it takes some time to return to a stable state due to a voltage drop and voltage bouncing of a power supply line Vcc. This increases the time lag for transitioning to the next access period, thereby increasing the access cycle time.

With the driving method of the present embodiment, N and M can be adjusted so that the access cycle time is reduced.

Specific examples of driving methods for adjusting N and M will now be described with reference to FIG. 3A, FIG. 3B and FIG. 4.

Driving Method 1

Figures 3A, 3B:
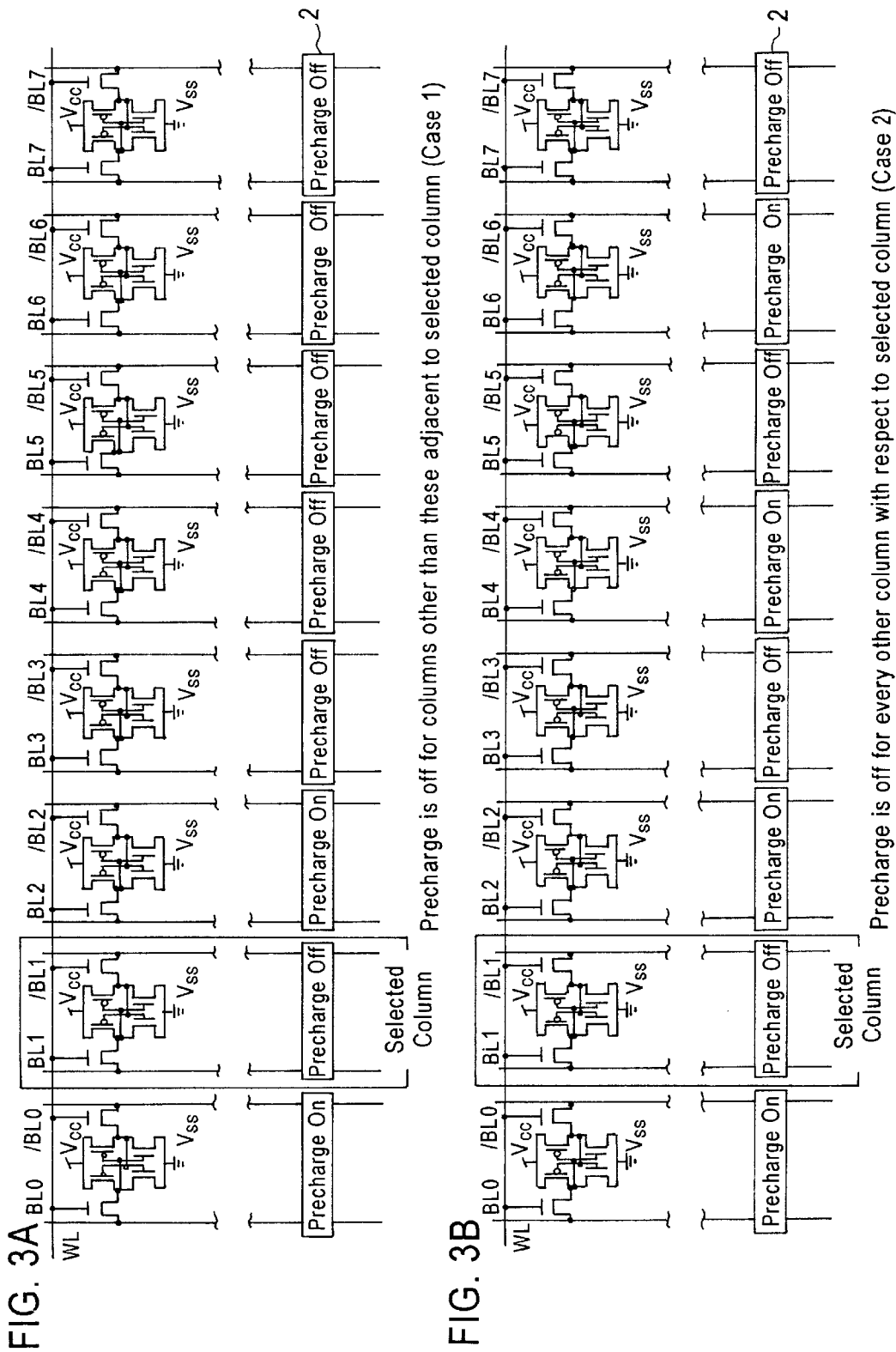
FIG. 3A and FIG. 3B are diagrams each illustrating a method for driving an SRAM device in one embodiment of the present invention.

FIG. 3A illustrates Driving Method 1, according to which the precharge operation is continued for all the bit line pairs other than the bit line pair (BL1 and /BL1) that is selected by a column selection operation. In other words, the selected bit line pair (BL1 and /BL1) is released from the precharged state if the bit line pairs (BL0 and /BL0) and (BL2 and /BL2) adjacent to the selected bit line pair (BL1 and /BL1) are both non-selected bit line pairs. With this method, the configuration of a precharge circuit 2 is as shown in "Case 1" in FIG. 4. With this method, all of the bit line pairs other than the bit line pairs (BL0 and /BL0) and (BL2 and /BL2) adjacent to the selected bit line pair (BL1 and /BL1) are in a non-precharged state, whereby N<M (the state described above in (2)). Therefore, the method is effective in a case where the word line WL access period is long, or in a case where the bit line capacitance is small and there is little occurrence of an alternating current in a precharge operation.

Driving Method 2

FIG. 3B illustrates Driving Method 2, according to which the precharge operation is continued for even-numbered bit line pairs (counting from an end bit line pair) if an odd-numbered bit line pair is selected by a column selection operation, while the precharge operation is continued for odd-numbered bit line pairs (counting from an end bit line pair) if an even-numbered bit line pair is selected by a column selection operation. This method can easily be realized as shown in "Case 2" in FIG. 4 as long as one bit of the address from which a column selection signal is produced is available. In this case, N is equal to M.

Driving Method 3

According to Driving Method 3, only the selected bit line pair is released from the precharged state, while the precharge operation is continued for the other bit line pairs. With this method, the number of bit line pairs (of all the bit line pairs available for the column selection operation) for which the precharge operation is continued is greater than the number of bit line pairs that are released from the precharged state upon access by the word line WL, i.e., N>M (the state described above in (1)). This method can easily be realized by controlling the precharge circuit 2 by using an AND circuit 3 illustrated in FIG. 4. This method provides significant effects of reducing the access cycle time, the power consumption, the power supply noise, etc., in a case where the word line WL access period is short or where the bit line capacitance is large and thus the alternating current occurring in the precharge operation is large.

Driving Method 4

The potential of each bit line of the selected bit line pair is rapidly changed from the power supply voltage level to the ground line level in a write operation. Therefore, there is substantial coupling noise to adjacent bit lines. According to the method shown in "Case 3" in FIG. 4, the bit line pair precharge operation is continued only during the word line WL access period in a write operation, so that N and M take different values in a read operation and in a write operation. In this way, it is possible to optimize the access cycle time, the power consumption and the power supply noise, whereby it is possible to expect greatest improvements to the problems described above.

As shown in Driving Methods 1 to 4 above, the present embodiment has been described with respect to a case where a data read/write operation is performed from/to the input/output section by using bit line pairs that are selected by a column selection operation. Alternatively, the present embodiment can be applied to a special SRAM device in which the bit line pair selection period is divided in two so that data is read out from odd-numbered bit line pairs (counting from an end bit line pair) during the first half and from even-numbered bit line pairs (counting from an end bit line pair) during the second half, for example. This can be achieved only by alternately performing the control operations shown in "Case 2" in FIG. 4. Therefore, the column selection operation as used in the present embodiment may also include a column selection operation such that the bit line pair selection period is divided into a number of sub-periods so that a plurality of bit line pairs are selected by selecting a single bit line pair in each of the sub-periods. This driving method is suitable for a case where data that is read out and written is processed in a pipelined process, and increases the data processing speed.

In the present embodiment, methods for driving a 6-transistor single-port SRAM device have been described. Alternatively, similar driving methods can be used for an 8-transistor 2-port SRAM device. In the case of an 8-transistor 2-port SRAM device, the bit line pairs can be grouped into two groups that do not need to be read out at the same time, wherein the precharge operation is continued for the bit line pairs of one group so that the bit line pairs behave as if they were power supply lines so as to shield the bit line pairs of the other group, thereby realizing a stable bit line access operation. The bit line pairs can be grouped into two groups so that bit line pairs associated with the same port belong to the same group. Alternatively, the bit line pair selection period can be divided in two.

In the present embodiment, the precharge circuit 2 is provided for each bit line pair so that the bit lines are controlled by pairs of adjacent bit lines. Of course, a configuration such that each bit line can be controlled independently may be employed so that each single bit line on either side of the selected bit line pair may be used as a shield line. Alternatively, in a case where each precharge circuit controls a plurality of bit line pairs, a number of bit line pairs may be used as shield lines. Thus, any configuration may be employed as long as bit lines adjacent to the selected bit line pair can be used as shield lines.

Next, the structure of the memory cell 10 provided in the SRAM device of the present embodiment will be described for each wiring layer.

Figure 5A:
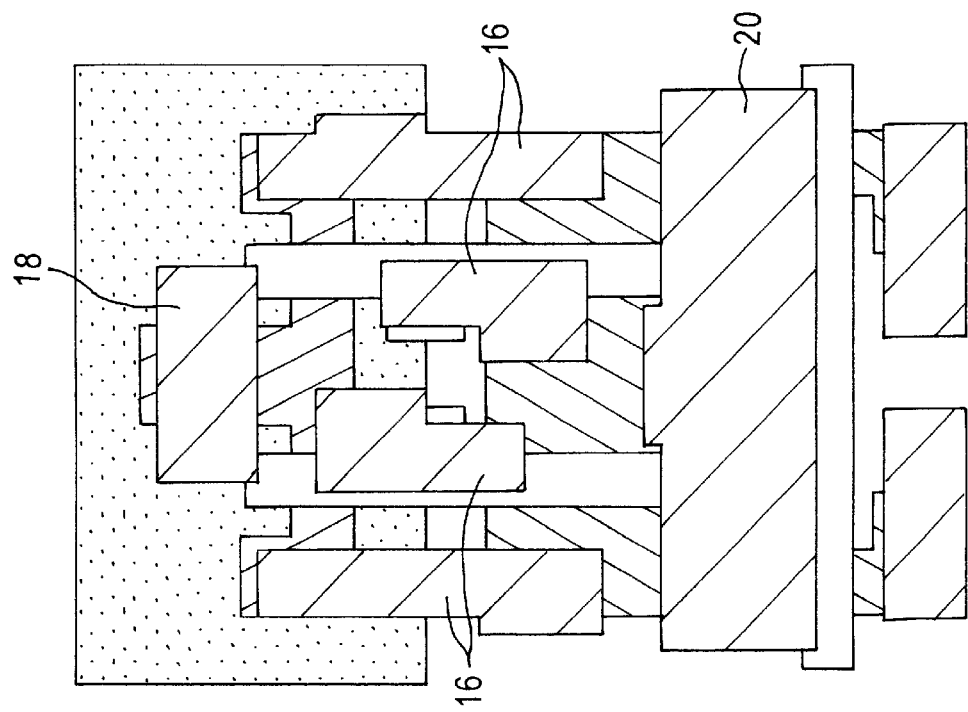
FIG. 5A is a diagram illustrating a transistor used in a memory cell of an SRAM device in one embodiment of the present invention.

FIG. 5A is a diagram illustrating a P-type active region 12 formed in an N-well region 11 on a semiconductor substrate, an N-type active region 13, a gate line 14, and the word line WL. As illustrated in FIG. 5A, the load transistors MP0, MP1, MN0 and MN1 and the access transistors MN2 and MN3 are formed. Moreover, cell nodes 15 connected to the transistors, a cell node 17 connected to the power supply line Vcc, and a cell node 19 connected to the ground line Vss, are provided.

Figure 5B:
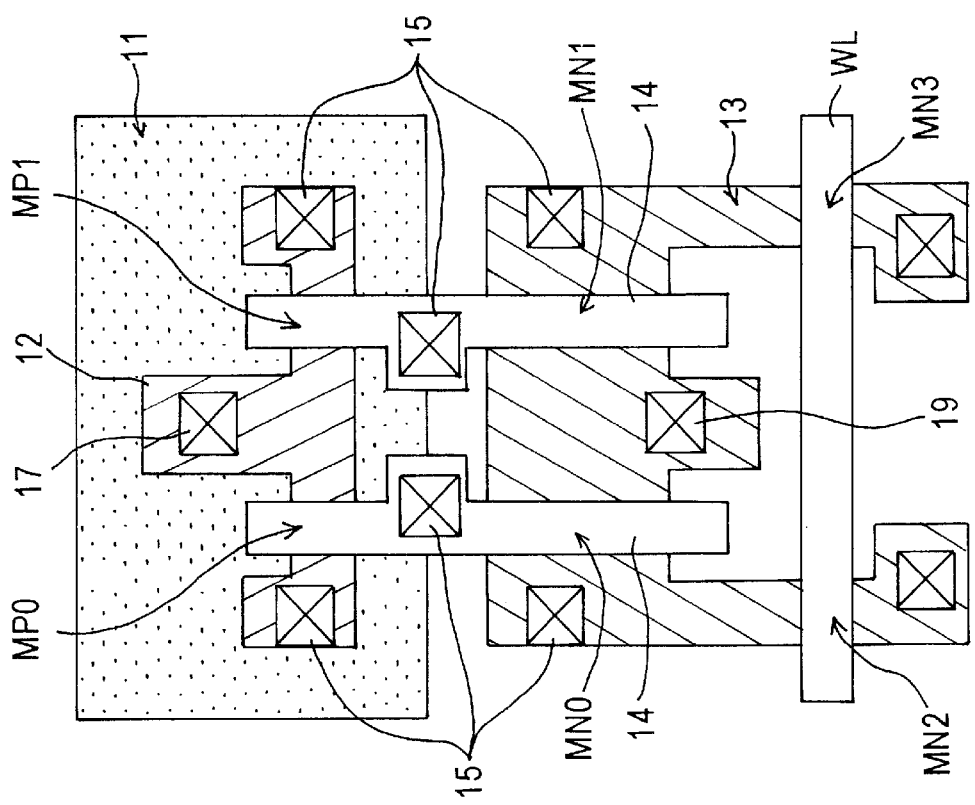
FIG. 5B is a diagram illustrating the structure of a first wiring layer of a memory cell of an SRAM device in one embodiment of the present invention.

FIG. 5B illustrates lines 16 for cross-coupling the cell nodes 15, a line 18 for connecting the cell node 17 to the power supply line Vcc, and a line 20 for connecting the cell node 19 to the ground line Vss. The lines 16, 18 and 20 are all formed in a first wiring layer.

Figure 6B:
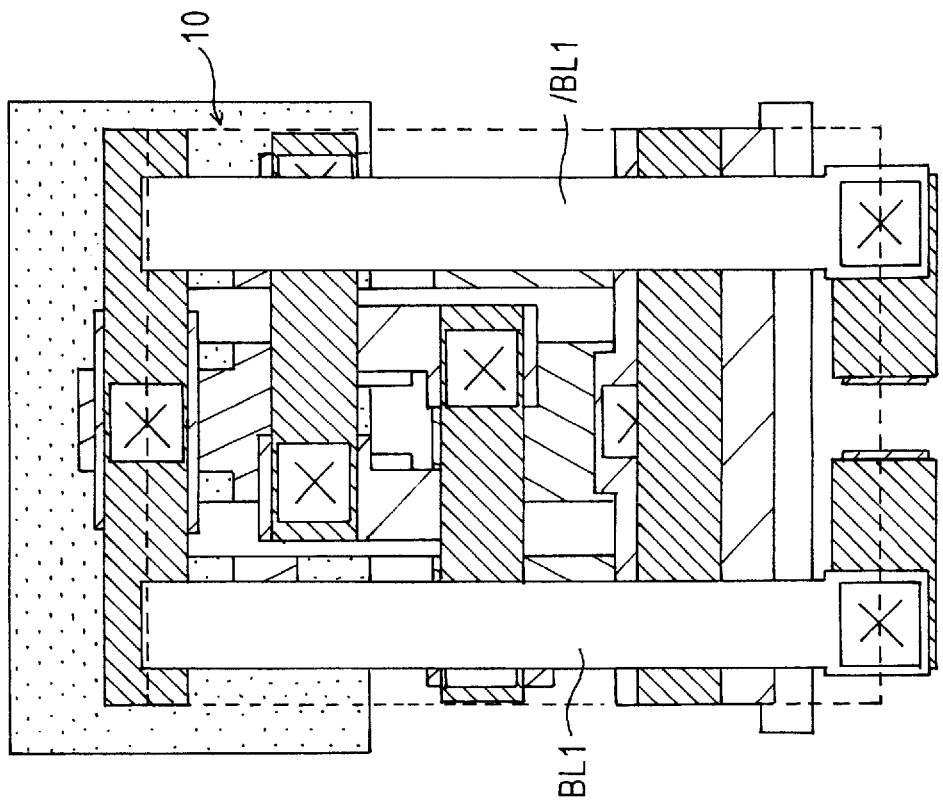
FIG. 6B is a diagram illustrating the structure of a third wiring layer of a memory cell of an SRAM device in one embodiment of the present invention.
Figure 6A:
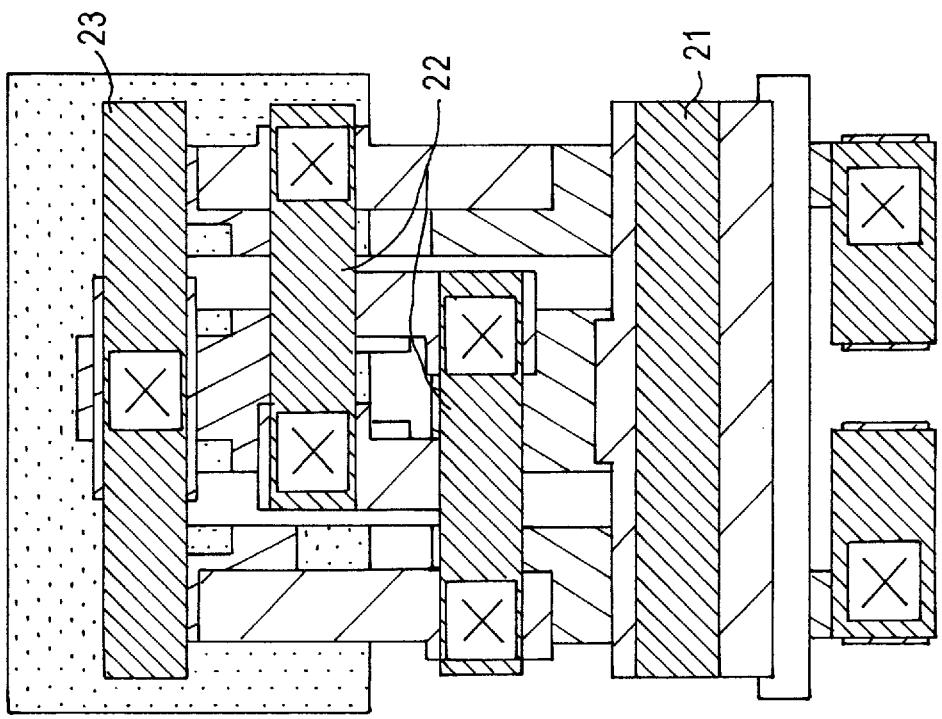
FIG. 6A is a diagram illustrating the structure of a second wiring layer of a memory cell of an SRAM device in one embodiment of the present invention.

FIG. 6A illustrates a backing line 21 for the word line WL, a line 22 for cross-coupling the cell nodes 15, and a line 23 used for the power supply line Vcc. The backing line 21 for the word line WL, the lines 22 and 23 are all formed in a second wiring layer.

FIG. 6B illustrates an arrangement of the bit lines BL1 and /BL1 in the SRAM device of the present embodiment. As illustrated in FIG. 6B, the bit lines BL1 and /BL1 are formed by using a third wiring layer, and the interval between the bit lines BL1 and /BL1 is larger than that in conventional SRAM devices.

As can be seen from FIG. 5A, FIG. 5B, FIG. 6A and FIG. 6B, the cross-coupling connection of the cell nodes 15 is provided by the lines 16 in the first wiring layer and the lines 22 in the second wiring layer, which are perpendicular to the lines 16 in the first wiring layer. The backing line 21 for the word line perpendicular to the bit lines BL1 and /BL1 is provided by using the second wiring layer, and the bit lines BL1 and /BL1 are provided so that the bit lines BL1 and /BL1 are the only lines in the third wiring layer.

As illustrated in FIG. 1A and FIG. 1B, the memory cell 10 of the present embodiment having such a configuration as described above includes the complementary data storage section S, the pair of bit lines (BL1 and /BL1), the word line WL, and the pair of access transistors (MN2 and MN3) connecting the pair of bit lines to the data storage section S. The complementary data storage section S includes a pair of CMOS inverters (one including the MOS transistors MP0 and MP1, and the other including the MOS transistors MN0 and MN1) that are cross-coupled to each other. Particularly, as compared to a conventional SRAM device, the interval between two adjacent bit lines /BL1 and BL2 is small, and the interval between the pair of bit lines BL1 and /BL1 is larger than that between the adjacent bit lines /BL1 and BL2.

Figure 7A:
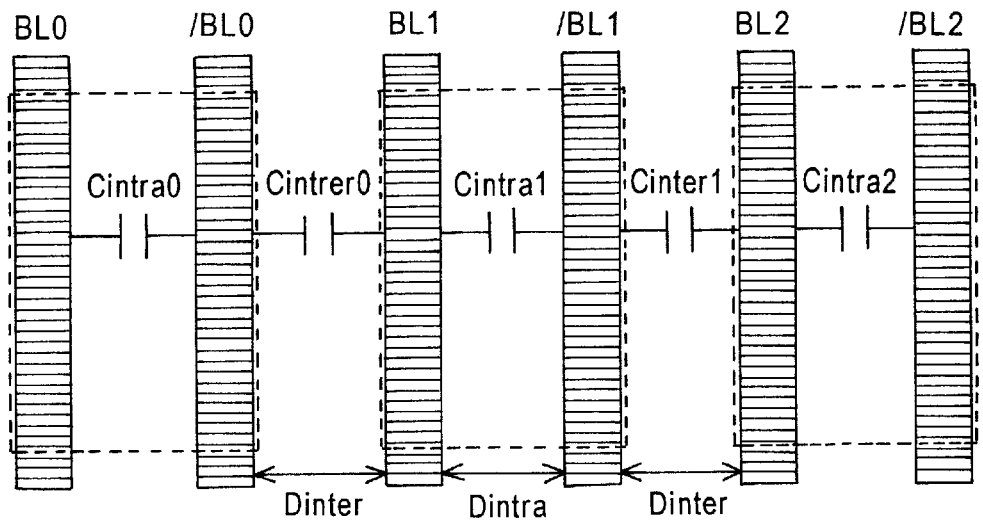
FIG. 7A is a diagram illustrating a bit line arrangement in a conventional SRAM device.

An SRAM device including the memory cell 10 having such a configuration is suitable for the driving methods of the present embodiment as described above, for the reasons to be described below with reference to FIG. 7A and FIG. 7B. FIG. 7A is a diagram illustrating a bit line arrangement in a conventional SRAM device, and FIG. 7B is a diagram illustrating a bit line arrangement in the SRAM device of the present embodiment.

When employing the conventional driving method, in which the precharge operation is not continued for adjacent bit line pairs (see FIG. 2B), an intra-pair capacitance Cintra occurring between a pair of bit lines, and an inter-pair capacitance Cinter occurring between bit line pairs, may both have a similar influence as coupling noise. Therefore, taking the worst case into consideration, it is unavoidable to have the bit lines arranged at regular intervals, as illustrated in FIG. 7A.

Figure 7B:
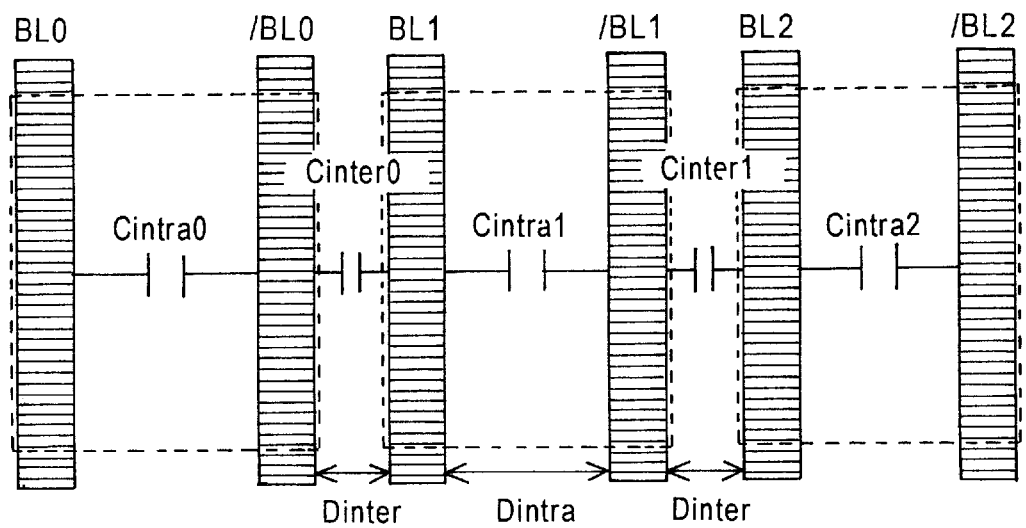
FIG. 7B is a diagram illustrating a bit line arrangement in an SRAM device in one embodiment of the present invention.
Figure 10:
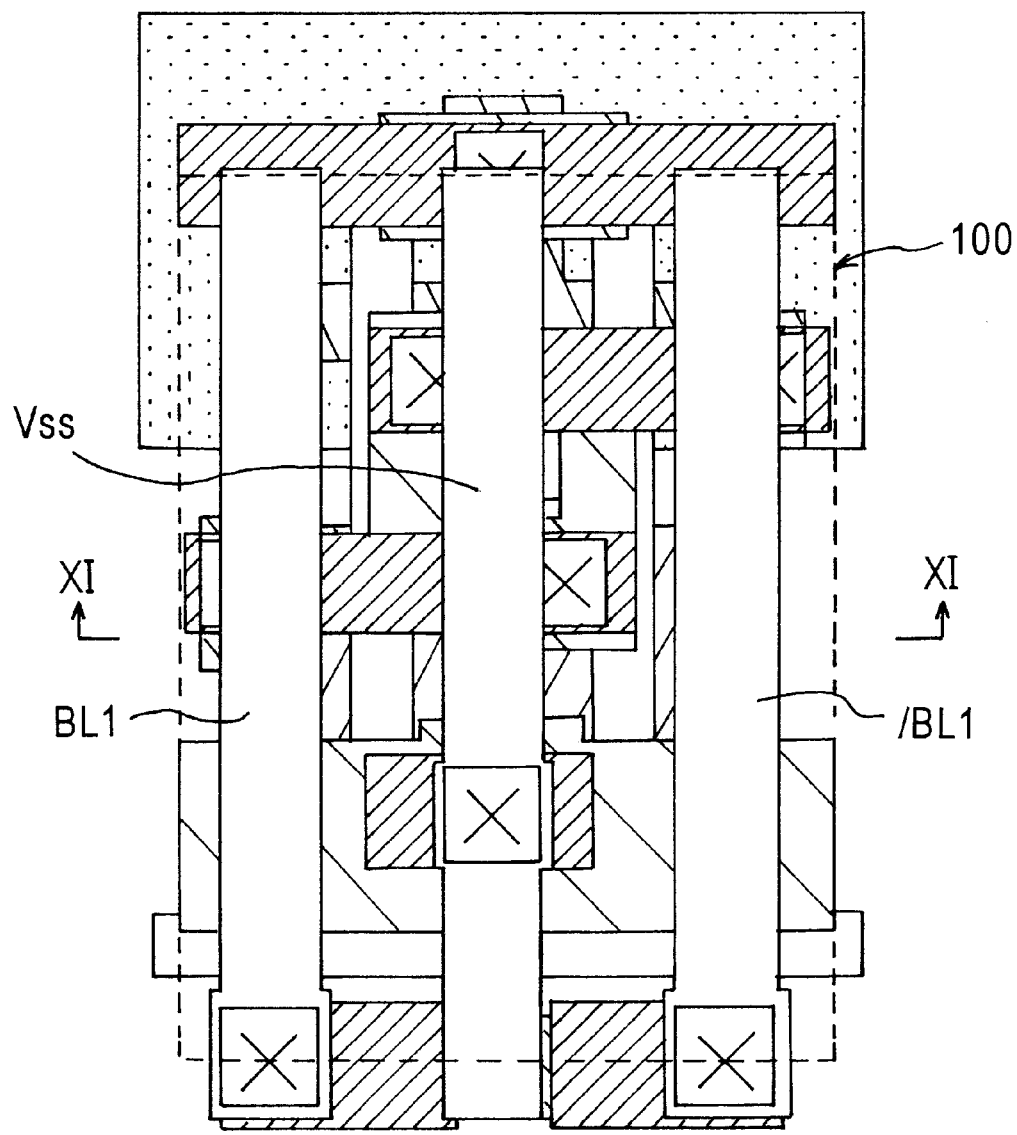
FIG. 10 is a diagram illustrating a memory cell of a conventional SRAM device.
Figure 11:
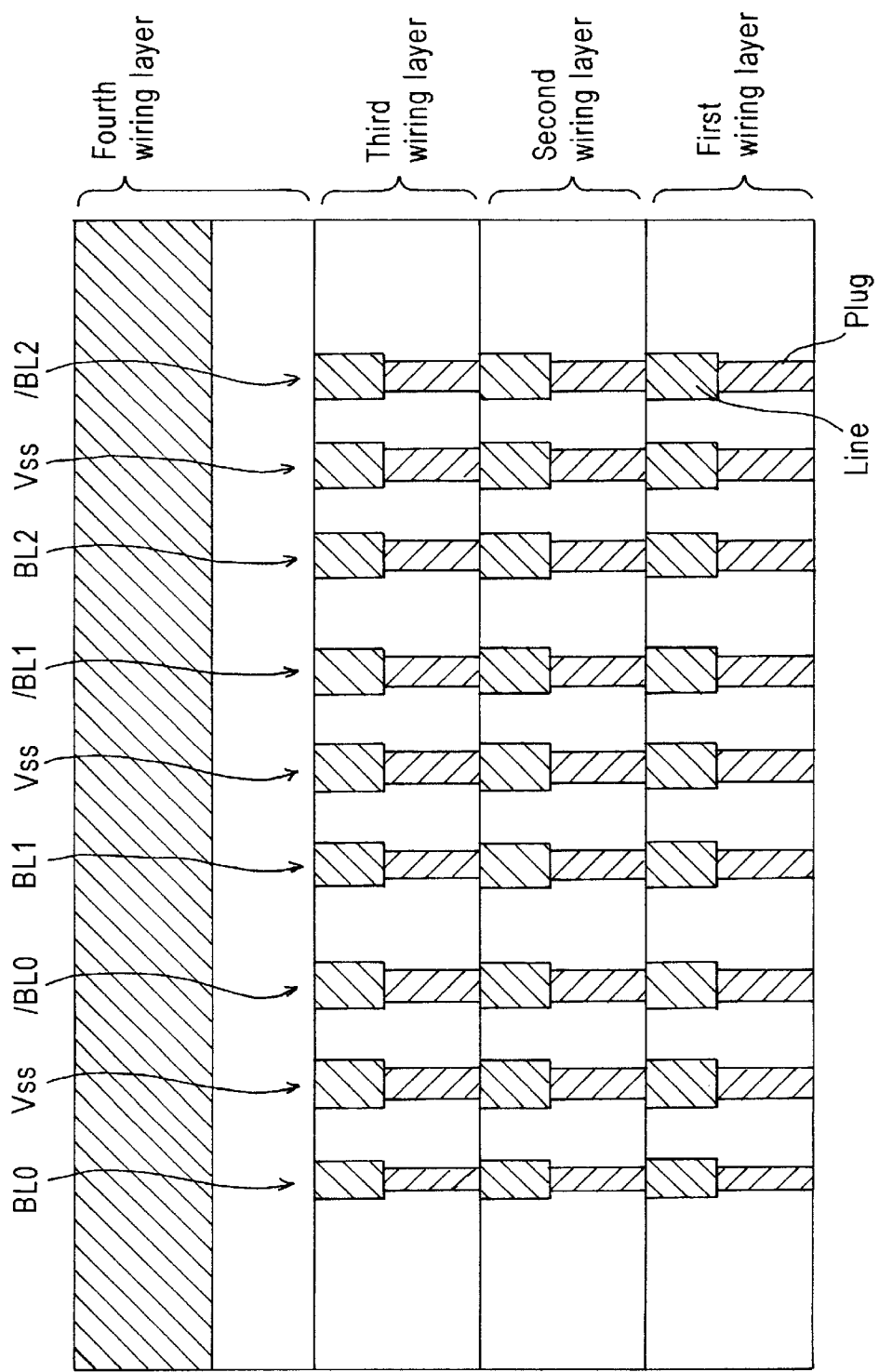
FIG. 11 is a cross-sectional view schematically illustrating a wiring layer of a conventional SRAM device.

With the driving method of the present embodiment, however, the precharge operation is continued for the adjacent bit line pairs (BL0 and /BL0) and (BL2 and /BL2) and thus the adjacent bit line pairs behave as if they were power supply lines, as illustrated in FIG. 7B. Therefore, it is no longer necessary to take into consideration the influence of the inter-line coupling between the selected bit line pair and each of the adjacent bit line pairs. Thus, the interpair capacitance Cinter does not have to be small, whereby it is possible to reduce a line interval Dinter, thus increasing the line interval Dintra between two bit lines of the same pair. Therefore, with the configuration of the memory cell 10 of the present embodiment, it is possible to reduce the intra-pair capacitance Cintra, thereby reducing coupling noise without separately providing a special-purpose shield line between the pair of bit lines (BL1 and /BL1).

Since the line interval Dintra between two bit lines of the same pair is large and no special-purpose shield line is provided between the two bit lines BL1 and /BL1, the two bit lines BL1 and /BL1 will not be short-circuited with the ground line Vss. Therefore, a short-circuit leak current is prevented from flowing via a precharge circuit while the two bit lines BL1 and /BL1 are precharged to the power supply voltage. Since the line interval Dinter is small, it is possible that a short-circuit occurs between adjacent bit lines of two adjacent bit line pairs (e.g., between /BL0 and BL1, or between /BL1 and BL2). However, since all the bit lines are at an equal potential when the bit lines are precharged to the power supply voltage, a short-circuit leak current does not occur due to the short-circuit. Thus, a short-circuit occurring between adjacent bit lines of two adjacent bit line pairs presents no problem.

In order to minimize the line capacitance in a bit line pair, it is preferred to maximize the line interval between bit lines of the same pair with respect to the bit line thickness. Specifically, in the present embodiment, the line interval in a bit line pair is larger (700 nm), and the line interval between two adjacent bit line pairs is smaller (300 nm), than the bit line thickness (540 nm where a 0.15 µm design rule is employed). Moreover, the effect of blocking electric force lines can be increased by providing a shield line in each of two wiring layers that are respectively above and below the wiring layer in which bit lines are formed. Particularly, the configuration of the memory cell 10 of the present embodiment provides significant effects when the ratio between the bit line thickness and the bit line width (aspect ratio) is greater than 2.

Moreover, in the memory cell 10 of the present embodiment, an even larger line interval can be obtained between a bit line and each of two wiring layers that are respectively above and below the bit line by providing a special-purpose wiring layer for bit lines (the third wiring layer) as illustrated in FIG. 6B.

FIG. 8A illustrates a fourth wiring layer used for the ground line Vss and the power supply line Vcc. FIG. 8B illustrates a substrate contact section (power supply crossing section) provided on a semiconductor substrate, with the memory cells 10 as illustrated in FIG. 8A being arranged in a matrix pattern in a region on the semiconductor substrate excluding the substrate contact section (power supply crossing section). FIG. 8B also shows an enlarged view of a portion of the structure.

As illustrated in FIG. 8A and FIG. 8B, in the memory cell 10 of the present embodiment, the ground line Vss includes a line in the first wiring layer and a line in the fourth wiring layer that are perpendicular to the bit lines, and the power supply line Vcc includes a metal line in the second wiring layer and a line in the fourth wiring layer that are perpendicular to the bit lines. Therefore, the ground line Vss and the power supply line Vcc can be used as shield lines sandwiching a bit line formed in the third wiring layer.

FIG. 9 is a cross-sectional view schematically illustrating wiring layers and connection holes in an area above three memory cells 10. FIG. 9 is a cross-sectional view taken along line IX—IX shown in FIG. 8A, schematically illustrating all the connection holes and the lines connected thereto being projected onto a plane.

As illustrated in FIG. 6B and FIG. 8B, lines in the first wiring layer and the fourth wiring layer are used for the ground line Vss. Moreover, lines in the fourth wiring layer used for the ground line Vss are connected, via plugs, to lines in the third wiring layer of the substrate contact section (power supply crossing section). However, as illustrated in FIG. 9, in each region above the memory cell 10, no contact hole or via hole is provided for connecting the fourth wiring layer to the other lower wiring layers including the third wiring layer, which is used for providing bit lines. In this way, it is possible to reduce the plug and/or line in the vicinity of a bit line as compared to that in the prior art. Therefore, it is possible to reduce the capacitance of the bit line itself, the intra-pair capacitance Cintra and the inter-pair capacitance Cinter.

What is claimed is:

1. An SRAM device, comprising:
   a plurality of bit line pairs that are arranged substantially parallel to one another and connected to different memory cells, respectively;
   selection means for selecting one bit line pair from among the plurality of bit line pairs; and
   potential holding means for applying a precharge potential of bit lines that are respectively on opposite sides of the bit line pair being selected,
   wherein an interval between two adjacent bit line pairs is smaller than an interval between two bit lines of the same bit line pair.

2. The SRAM device of claim 1, wherein the potential holding means holds a precharge potential of all of the plurality of bit line pairs excluding the selected bit line pair.

3. The SRAM device of claim 1, wherein the potential holding means holds a precharge potential of odd-numbered bit line pairs, counting from the selected bit line pair, and does not hold a precharge potential of even-numbered bit line pairs, counting from the selected bit line pair.

4. The SRAM device of claim 1, wherein the number of bit line pairs whose precharge potential is held by the potential holding means is greater than the number of bit line pairs whose precharge potential is not held by the potential holding means.

5. The SRAM device of claim 1, wherein the potential holding means holds a precharge potential only in a write operation.

6. The SRAM device of claim 1, wherein the interval between two adjacent bit line pairs is smaller, and the interval between two bit lines of the same bit line pair is larger, than a thickness of each bit line of the plurality of bit line pairs.

7. The SRAM device of claim 1, further comprising a plurality of wiring layers, wherein one of the plurality of wiring layers in which the bit lines are provided includes no line other than the bit lines in regions above the memory cells.

8. The SRAM device of claim 7, wherein:

the plurality of wiring layers include a first wiring layer, a second wiring layer, a third wiring layer and a fourth wiring layer, which are layered in this order;

ground lines of the memory cells are provided in the first wiring layer and the fourth wiring layer so as to be perpendicular to the bit lines;

power supply lines of the memory cells are provided in the second wiring layer and the fourth wiring layer so as to be perpendicular to the bit lines; and the bit lines are provided in the third wiring layer.

9. The SRAM device of claim 8, wherein in regions above the memory cells, no connection hole is provided for connecting the fourth wiring layer to other lower wiring layers including the third wiring layer.

10. An SRAM device, comprising:

a plurality of bit line pairs that are arranged substantially parallel to one another and connected to different memory cells, respectively;

first selection means for selecting one odd-numbered bit line pair, counting from an end bit line pair, from among the plurality of bit line pairs;

first potential holding means for holding a precharge potential of even-numbered bit line pairs, counting from the end bit line pair, with the one odd-numbered bit line pair being selected;

second selection means for selecting one even-numbered bit line pair, counting from the end bit line pair, from among the plurality of bit line pairs; and second potential holding means for holding a precharge potential of odd-numbered bit line pairs, counting from the end bit line pair, with the one even-numbered bit line pair being selected, wherein an interval between two adjacent bit line pairs is smaller than an interval between two bit lines of the same bit line pair.

11. The SRAM device of claim 10, wherein the interval between two adjacent bit line pairs is smaller, and the interval between two bit lines of the same bit line pair is larger, than a thickness of each bit line of the plurality of bit line pairs.

12. The SRAM device of claim 10, further comprising a plurality of wiring layers, wherein one of the plurality of wiring layers in which the bit lines are provided includes no line other than the bit lines in regions above the memory cells.

13. The SRAM device of claim 12, wherein:

the plurality of wiring layers include a first wiring layer, a second wiring layer, a third wiring layer and a fourth wiring layer, which are layered in this order;

ground lines of the memory cells are provided in the first wiring layer and the fourth wiring layer so as to be perpendicular to the bit lines;

power supply lines of the memory cells are provided in the second wiring layer and the fourth wiring layer so as to be perpendicular to the bit lines; and the bit lines are provided in the third wiring layer.

14. The SRAM device of claim 13, wherein in regions above the memory cells, no connection hole is provided for connecting the fourth wiring layer to other lower wiring layers including the third wiring layer.

* * * * *